US006785133B2

(12) United States Patent
Barringer et al.

(10) Patent No.: US 6,785,133 B2
(45) Date of Patent: Aug. 31, 2004

(54) HIGH DENSITY MODULAR INPUT/OUTPUT PACKAGE IN A DATA PROCESSING SYSTEM

(75) Inventors: Dennis R. Barringer, Wallkill, NY (US); Philip M. Corcoran, Highland, NY (US); William P. Kostenko, Poughkeepsie, NY (US); Edward J. Seminaro, Milton, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/256,605

(22) Filed: Sep. 27, 2002

(65) Prior Publication Data

US 2004/0062002 A1 Apr. 1, 2004

(51) Int. Cl.[7] .................................................. H05K 5/00
(52) U.S. Cl. ........................ 361/694; 361/695; 361/727
(58) Field of Search ............................... 361/684–687, 361/725–735, 790

(56) References Cited

U.S. PATENT DOCUMENTS

| 4,672,509 A | 6/1987 | Speraw | 361/384 |
|---|---|---|---|
| 5,317,477 A | 5/1994 | Gillett | 361/683 |
| 6,025,989 A | 2/2000 | Ayd et al. | 361/695 |
| 6,137,684 A | 10/2000 | Ayd et al. | 361/727 |
| 6,208,522 B1 * | 3/2001 | Manweiler et al. | 361/752 |
| 6,456,498 B1 * | 9/2002 | Larson et al. | 361/752 |
| 6,556,438 B1 * | 4/2003 | Bolognia et al. | 361/687 |
| 6,594,150 B2 * | 7/2003 | Creason et al. | 361/727 |

OTHER PUBLICATIONS

U.S. patent application Ser. #10/194,799, filed Jul. 12, 2002, Dennis R. Barringer et al., "Apparatus for Auto Docking PCI Cards".

* cited by examiner

Primary Examiner—Darren Schuberg
Assistant Examiner—Anthony Q. Edwards
(74) Attorney, Agent, or Firm—Floyd A. Gonzalez

(57) ABSTRACT

An I/O subsystem for providing a high density modular input/output package in a data processing system. The I/O subsystem includes an enclosure having a midplane assembly in the center portion. The enclosure includes electrical components including redundant power supplies, air moving units and DASD carriers having DASD drives assemblies therein in the front portion of the enclosure, and planar boards having PCI card assemblies slidably mounted thereon in the rear portion of the enclosure. The mid plane includes multiconductor power buses for distribution of power from the power supplies to the electrical components of the I/O subsystem.

9 Claims, 11 Drawing Sheets

HIGH DENSITY MODULAR INPUT/OUTPUT PACKAGE IN A DATA PROCESSING SYSTEM

BACKGROUND OF THE INVENTION

The present invention relates to high density arrangement of elements in a single package, and more particularly relates to high density arrangement of a modular Input/Output (I/O) package in a data processing system.

Packaging inefficiency in the area of I/O has previously been identified by others, and an attempt has been made to create an improved structure. However, the resulting efforts have only moderately improved density and in many cases have resulted in the application of unique I/O cards as opposed to the use of standard PCI adapter cards.

U.S. Pat. No. 5,672,509 issued Jun. 9, 1987 to Speraw for AIR COOLING ASSEMBLY IN AN ELECTRONIC SYSTEM ENCLOSURE discloses an air cooling assembly in a system enclosure for cooling a plurality of logic module cassettes located in the system enclosure.

U.S. Pat. No. 5,317,477 issued May 31, 1994 to Gillett for HIGH DENSITY INTERCONNECTION ASSEMBLY discloses a high density computer interconnection assembly in which a plurality of flat packages are slidably mounted along a rack in a frame, an interconnection circuit board at right angles and connected to components in the flat packages, and memory cards coupled to the opposite side of the circuit board.

U.S. Pat. No. 6,025,989 issued Feb. 15, 2000 to Ayd et al. for MODULAR NODE ASSEMBLY FOR RACK MOUNT MULTIPROCESSOR COMPUTER discloses a modular node assembly wherein a removable chassis having disk drives, power supply, and a fan is removably mounted in a logic chassis having processor cards, I/O cards and memory cards.

U.S. Pat. No. 6,137,684 issued Oct. 24, 2000 to Ayd et al. for CAMMING MECHANISM FOR JOINING MODULAR ELECTRONIC ENCLOSURES discloses a camming and latching mechanism for locking a removable chassis having disk drives, power supply, and a fan into a logic chassis having processor cards, I/O cards and memory cards.

SUMMARY OF THE INVENTION

I/O and storage devices are key components in any server. The overhead required to employ these devices in a server greatly affects the resulting physical size, cost and availability of a server. The present invention has enabled a single enclosure of I/O and storage hardware to replace what has been approximately three enclosures of a similar physical size in previous product offerings, with the single enclosure having improved fault tolerance over the multiple enclosure approach. The single enclosure approach reduces cost and component count appreciably.

A unique packaging and subsystem structure has been invented that makes it possible to contain, power, cool and maintain concurrently (hot plug) a large amount of high performance I/O and storage hardware in a very compact space in a low cost fashion with a clean and neat physical appearance. This structure has components arranged so that all parts in the enclosure can be serviced without sliding out or removing the enclosure from the system. The I/O and storage hardware contained within the structure includes:

20 full length/full power Peripheral Component Interconnect (PCI) cards;
2 high bandwidth I/O planars each with a dual host connection;
4 imbedded Small Computer System Interface (SCSI) controllers (2 contained on each I/O planer);
16 one inch high speed SCSI hard drives; and
4 Hard Drive Backplanes.

It is an object of the present invention to use a modular puzzle like structure that packages components within fault containment regions in a hierarchical fashion that enables concurrently maintaining the most failure prone components without disturbing any other component in the unit, and then maintaining a second level of less failure prone fault containment regions without affecting other such regions in the unit.

It is a further object of the present invention to use cassettes to house PCI cards enabling simple insertion and extraction of I/O adapters.

It is a further object of the present invention to use the physical positioning of the 2nd level fault containment regions with respect to one another to enable the use of only two centric power supplies and four air moving devices to power and cool all I/O and storage hardware in the enclosure with complete power and cooling hardware fault tolerance (redundancy). The use of high speed instantaneous current limiting hardware on the 2nd level and 1st level fault containment regions is also an employed technique that enables this.

It is a further object of the present invention to use service controllers packaged internal to the two redundant power supplies so that the service control function is fully redundant, fault tolerant and concurrently maintainable. This technique enables the higher density achieved by eliminating service controls on each 2nd level fault containment region. The use of redundant service controllers improves availability considerably, and assures that a controller is always available to light the amber LED's (Light Emitting Diodes) that are carefully placed throughout the unit to identify components that require replacement.

It is a further object of the present invention to use the association of elements with respect to one another to enable proper airflow over the components without a significant amount of dedicated space for air flow management. Adequate air flow is maintained over all components even in the case of an air moving device failure or temporary removal of a faulty element that must be replaced. Air is pulled through the power supply units and disk drives by the air moving devices and is exhausted across the components on the planar board through the PCI adapter cards.

It is a further object of the present invention to use simple air moving devices that physically contain only a simple motor and wheel, and rely on brushless/sensorless drive electronics contained within the power supplies. This technique enables the air moving devices to be buried within the unit, behind 2nd level fault containment regions due to the very low air moving device failure rate that this technique yields.

It is a further object of the present invention to package all of the I/O and storage components and the supporting power and cooling hardware with a minimum number of wire type cables, thereby providing a clean and neat appearance and aiding ease of service. All of the units in the drawer blind plug through the use of autodocking connectors easing service operations.

It is a further object of the present invention to use a completely passive compact mid-plane structure in the center of the enclosure to interconnect the 2nd level fault containment regions. The completely passive nature of this element provides the required level of availability for this element, since it represents the only potential single point of failure in the subsystem.

It is a further object of the present invention to use a 4 EIA high overall enclosure that mounts in a standard 24" EIA rack, thereby providing system level packaging flexibility.

It is a further object of the present invention to use an enclosure level power and service control interface that consists of 4 identical compact cables, which plug directly into the front of the power supplies. These interfaces provide cross redundant connections to the entire subsystem very cost effectively, with the capability of concurrently servicing any of the cables. Each of the interface cables contain 350 VDC power and a full duplex differential RS-422 control interface.

It is another object of the present invention to provide a component arrangement that enables servicing all parts in the enclosure without sliding the unit out or removing it from the system.

It is another object of the present invention to provide a component arrangement that enables a full compliment of fault identification LED's (1–2 per serviceable unit), with all of the LED's being physically packaged on the components of the unit as opposed to on a dedicated unit for LED's, and with all of the LED's being visible from the front and rear of the enclosure with the enclosure fully installed in the system.

It is another object of the present invention to provide an air moving device with a unique latching and retention mechanism that enables it to be concurrently maintained after removing a DASD backplane assembly.

BRIEF DESCRIPTION OF THE DRAWINGS

These and other objects will be apparent to one skilled in the art from the following detailed description of the invention taken in conjunction with the accompanying drawings in which.

DESCRIPTION OF THE PREFERRED EMBODIMENT

Figure 1:
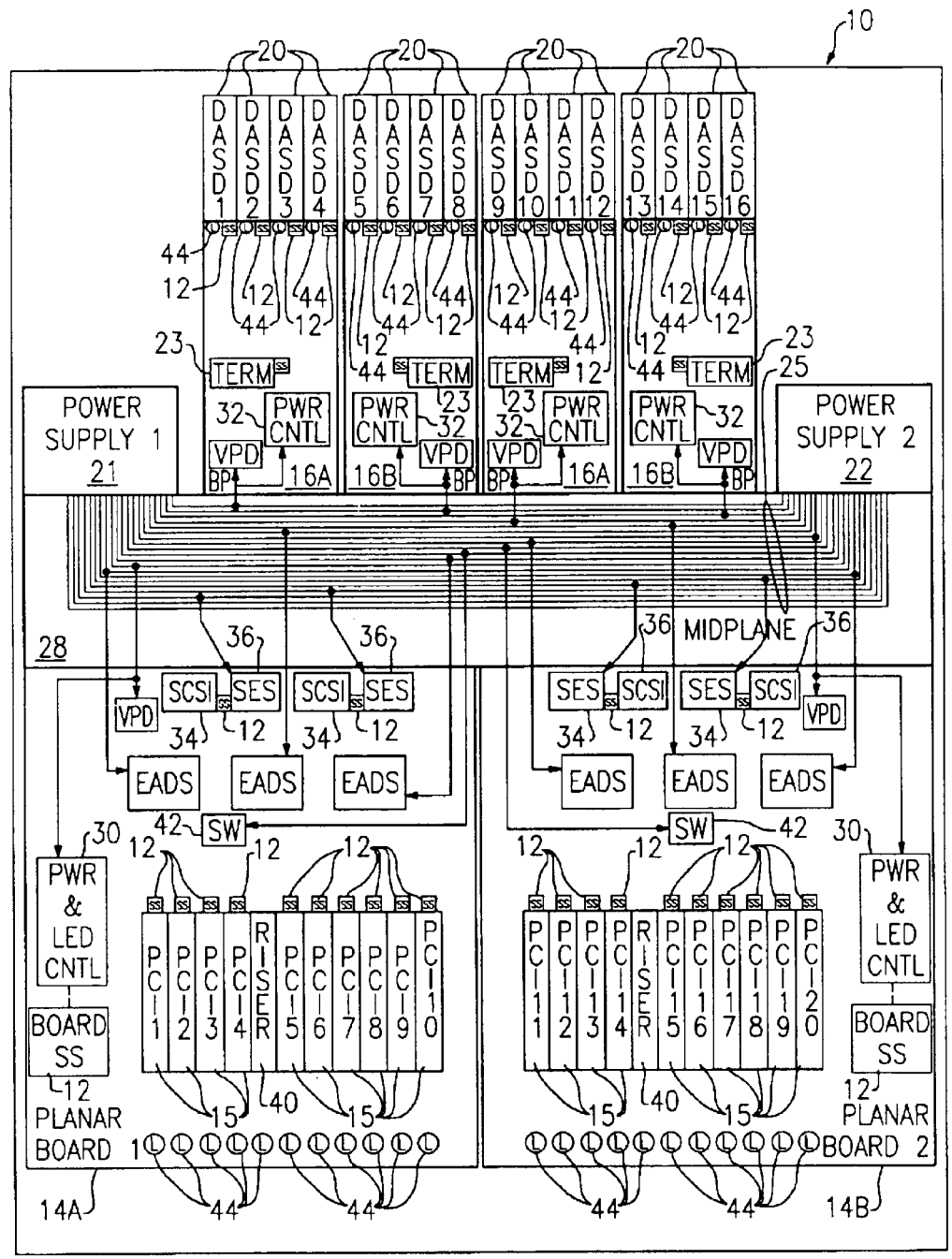
FIG. 1 is a block diagram of the I/O subsystem of the present invention.

FIG. 1 is a block diagram of the I/O subsystem 10 of a data processing system. The data processing system may be any of IBM pSeries p690, p670, or p655 and follow-on servers available from International Business Machines Corporation. The I/O subsystem 10 of the present invention may include two planar boards 14A and 14B. Each planar board includes a number of Peripheral Component Interconnect (PCI) cards 15 for connection into the data processing system, as is well known in the art. For example, planar board 14A includes cards PCI1-PCI10, while planar board 14B includes cards PCI11–PCI20. Each planar board 14 is connected to a pair of DASD backplanes 16A and 16B, and each backplane 16 includes 4 DASD devices 20. Thus, for instance, planar board 14A connects to 8 DASD devices (DASD1–DASD8), and planar board 14B connects to 8 DASD devices (DASD9–DASD16). Each DASD backplane 16 also includes terminators 23.

Redundant power supplies 21 and 22 supply power over power busses 25 in a midplane 28 between the planar boards 14A–14B and the back planes 16A–16B. Power is supplied to a power and Light Emitting Diode (LED) control 30 for each board, which controls power to its planar board 14. Each backplane 16 also includes a power control 32 which is connected to a power bus in the midplane 28, and controls power to the backplane. The planar board 16 is protected by a soft switch 12, as well as each of the PCI cards 15. In the backplanes 16, each of the DASD devices 20 and the terminators 23 are protected by a soft switch 12. The soft switches 12 are fully disclosed in U.S. patent application Ser. No. 10/256,296 filed Sep. 27, 2002 for OVERCURRENT PROTECTION OF INPUT/OUTPUT DEVICES IN A DATA PROCESSING SYSTEM, (Attorney docket number POU920020120US1) owned by the assignee of the present invention, which application is incorporated herein by reference.

In each planar board 14, a Small Computer System Interface (SCSI) module 34 is provided to provide the protocols for communication between the DASD devices and the PCI bus, as is well known. Backplane assemblies, to be explained, are designed to carry up to 4 DASD devices 20, and are designed to be hot plugged. The SCSI Environmental Services (SES) modules 36 on the planar boards 14 will assert the SCSI reset line during hot removal and hot plug to minimize disruption on the SCSI bus. The hot plug reset function will be controlled by short, medium and long pins on interposer connectors in the carrier assemblies, as is well known.

Each planar board 14 includes a riser 40 to provide cable connectors for connecting the I/O subsystem 10 to processors of the data processing system, as is well known. Each planar board 14 includes a speedwagon 42 which is a processor-to-PCI bridge module. The end of the planar board 14 includes a plurality of LEDs 44, two for each PCI card 15 and the riser 40 for indicating the status of its respective card or riser. Each DASD backplane 16 also includes 10 LEDs 44 for indicating the status of its respective drives and air moving devices mounted behind them. The LEDs are visable through lightpipes.

Figure 2:
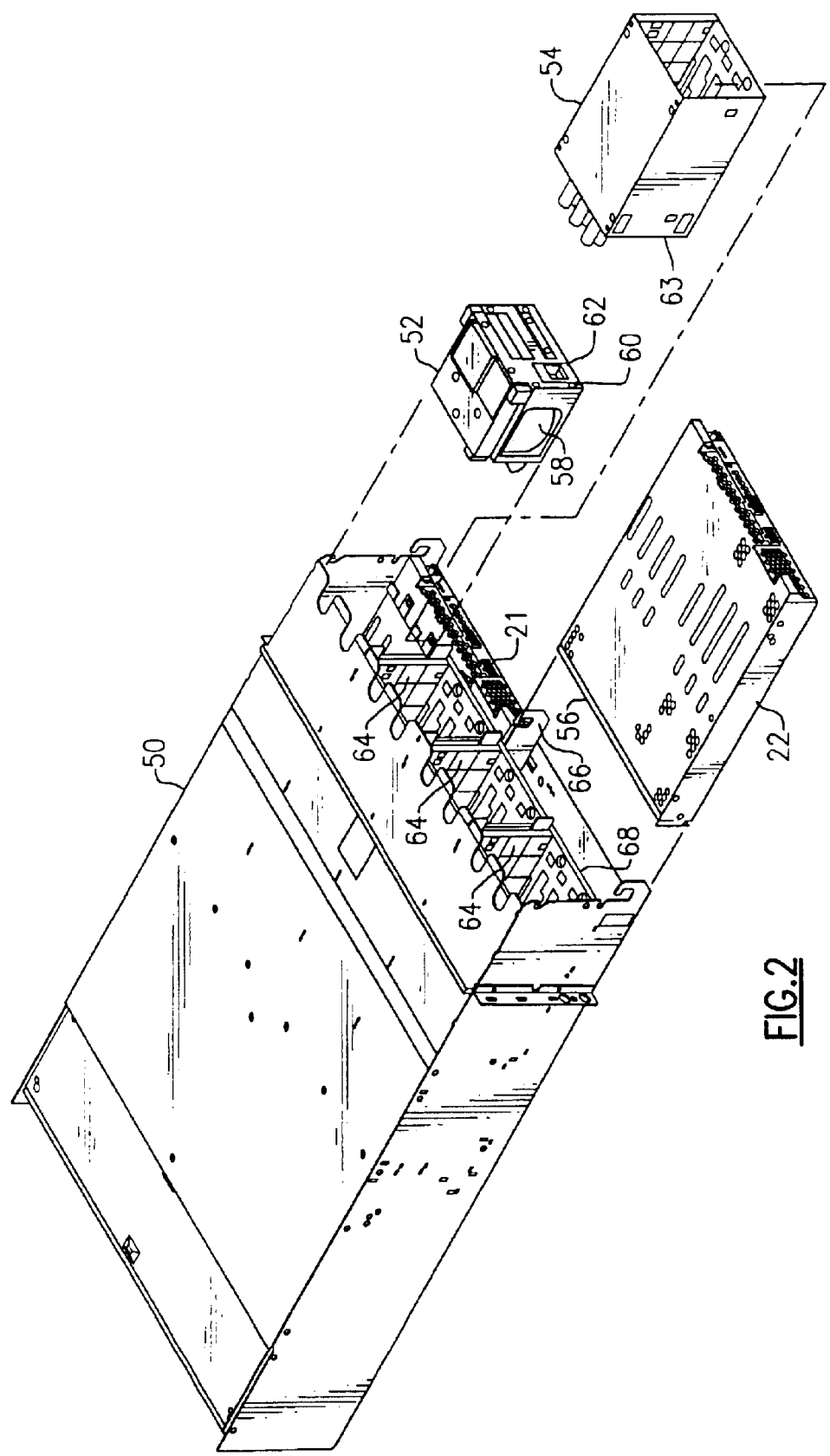
FIG. 2 is a partially exploded front view of an enclosure for containing the I/O subsystem of FIG. 1, and showing a fully inserted first power supply module and showing a second power supply module, air moving device and a 4-pack DASD carrier exploded.
Figure 5:
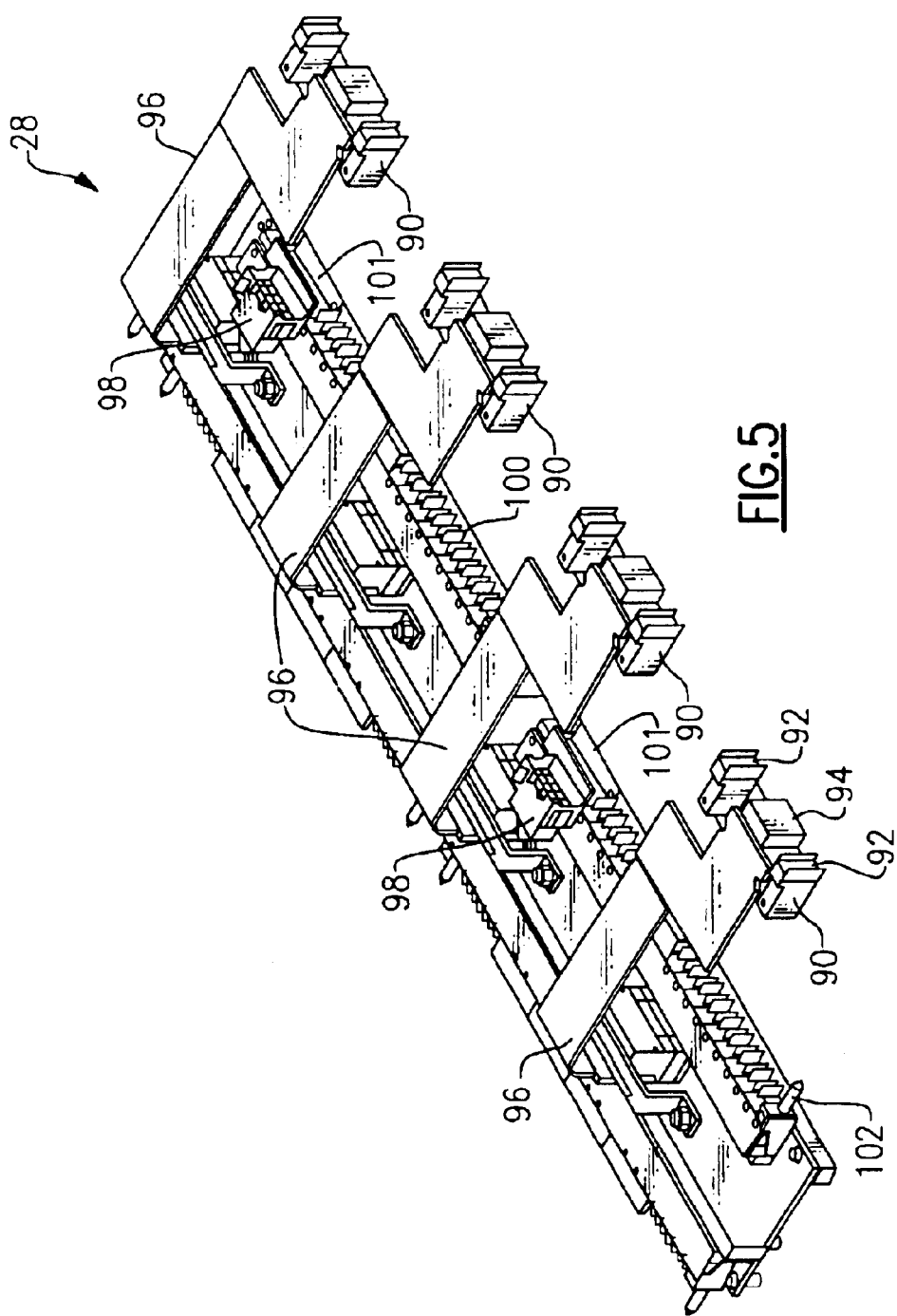
FIG. 5 is a front view of the midplane of the present invention.

FIG. 2 is a partially exploded front view of an enclosure 50 for containing the I/O subsystem of FIG. 1. FIG. 2 shows the first power supply module 21 fully inserted into the enclosure 50, and the second power supply module 22, an air moving device 52 and a 4-pack DASD carrier 54 exploded. The power supply modules 21 and 22 have connectors 56 at the rear for plugging into the midplane 28 (as will be explained). The air moving device 52 is a centrifugal type blower which takes air in from the bottom and discharges air from openings 58 in the side of the air moving device. The air moving device 52 further includes a latch 60 at the bottom with an actuation device 62 in the front. The top of the front of the enclosure 50 is divided into four bays by three stiffeners 64, and the bottom of the enclosure 50 is divided into two bays by a stiffener 66. The top and bottom parts of the front portion of enclosure 50 are divided by a horizontal stiffener 68. Each of the top four bays are sized to receive a 4-pack DASD carrier 54. Four air moving devices 52 are pushed into the four top front bays and latched into place by the latch 60 on each air moving device 52. Connectors in the air moving device 52 and on enclosure 50, to be discussed in connection with FIG. 5, are mated to supply power and controls to the air moving device. The four DASD carriers 54 are then slidably located into the four top bays and seated such that connectors 63 on the back of the DASD carriers 54 are mated with connectors in the enclosure 50, to be discussed in connection with FIG. 5. The air moving units 52 are sized to pass under their connectors and pass over connectors in the midplane 28 which mate with the connectors 63 of the DASD carriers 54.

Figure 3:
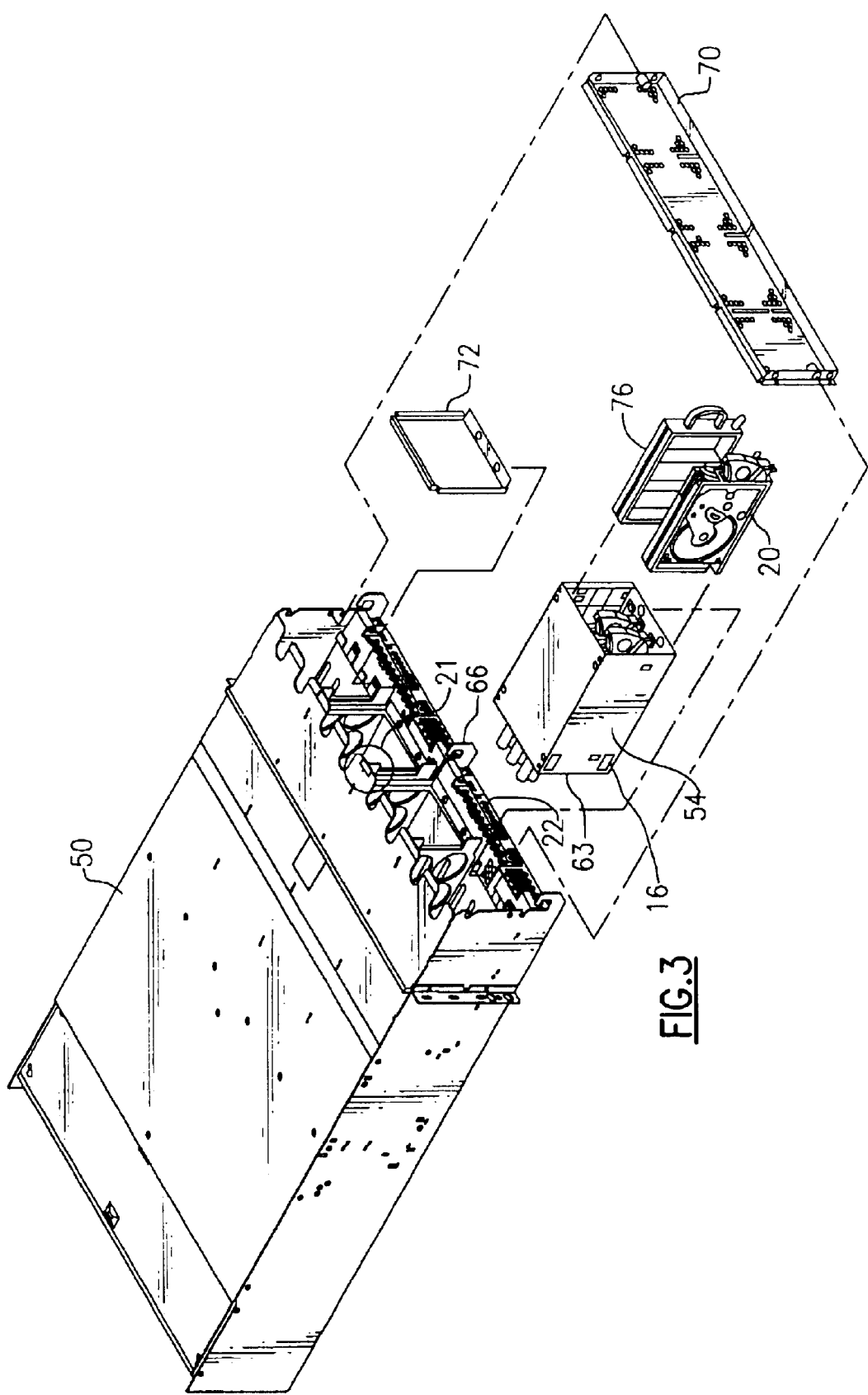
FIG. 3 is a partially exploded front view of the enclosure showing the two power supplies fully seated in the enclosure, a 4-pack DASD carrier, a front cover, and a DASD filler exploded from the enclosure with a DASD drive assembly and a DASD blank cartridge exploded from the 4-pack DASD carrier.

FIG. 3 is a partially exploded front view of the enclosure 50 showing the two power supplies 21 and 22 fully seated in the enclosure 50. A DASD carrier 54, a front cover 70, and a DASD filler 72 are shown exploded from the enclosure 50. Each DASD carrier 54 includes a backplane 16 which carries up to four DASD drive assemblies 20. When one of the DASD assemblies is not used, a DASD blank cartridge 76 is used to preserve cooling air flow. If a DASD carrier 54 is not used, a DASD filler 72 is used to cover its empty bay to preserve cooling air flow. Finally, a front cover 70 is placed over the front of the enclosure.

Figure 4:
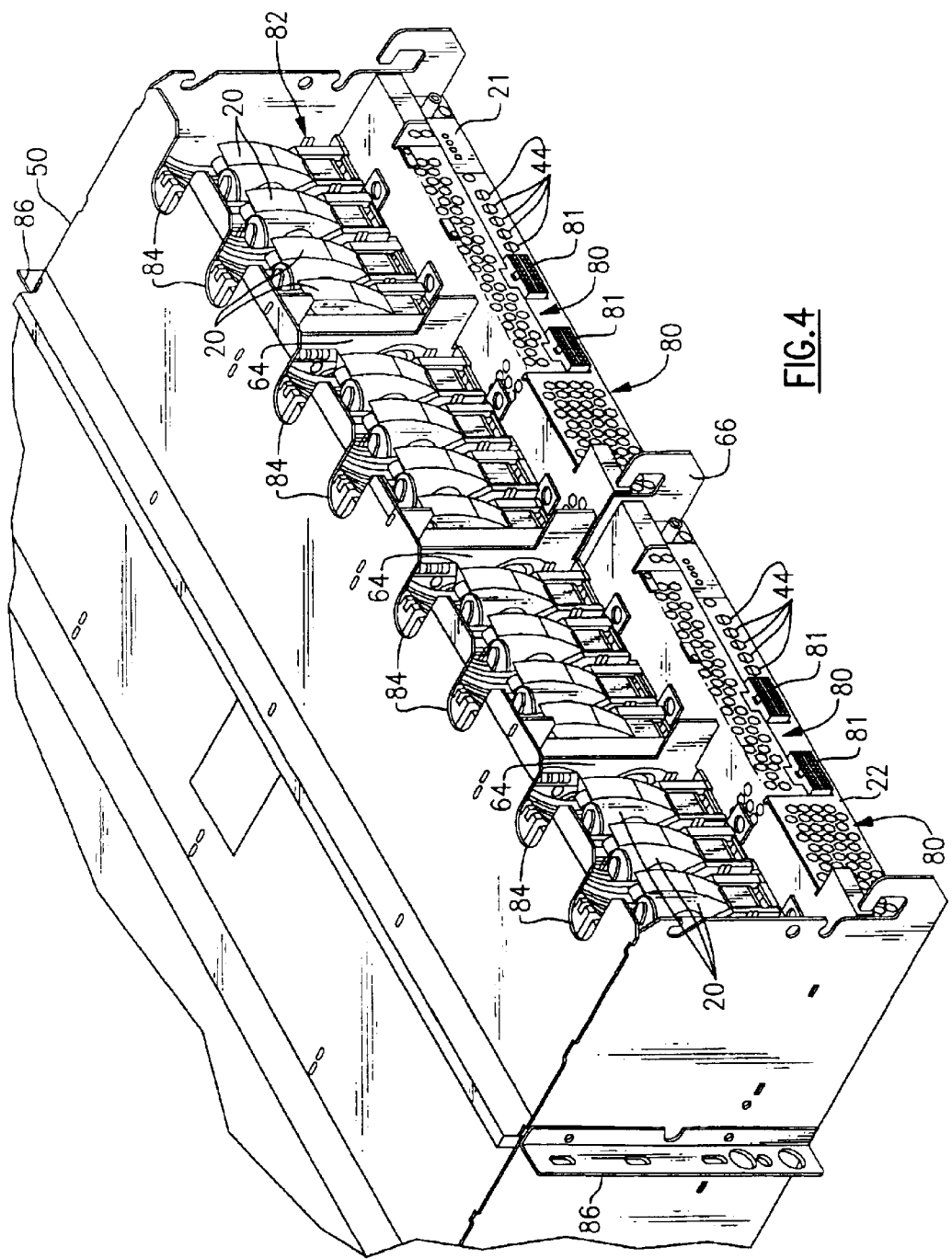
FIG. 4 is a partial front view of the enclosure of the present invention showing the power supplies and DASD drive assemblies fully seated in the enclosure.

FIG. 4 is a partial front view of the enclosure 50 showing the power supplies 21 and 22 and DASD carriers 54 carrying the DASD drive assemblies 20 fully seated in the enclosure 50. The front cover 70 has been removed in FIG. 4 to show the arrangement of the DASD drive assemblies 20. The front of the power supplies 21 and 22 have a row of LEDs 44 for showing the status of the components in the power supplies. Also, the front of the power supplies have pluralities of cooling air holes 80. Each DASD drive 20 includes a pair of light pipes 82 to show the status of the respective DASD drive 20. These light pipes 82 are visible when the cover 70 is in place. The cover 70 also has cooling air holes to allow cooling air to be drawn into the enclosure 50 to cool the DASD drives 20. The top of the enclosure 50 also has slots 84 to allow cooling air to be drawn over the DASD drives 20, and to allow a place to grasp the DASD carriers 54 for easy removal. The enclosure 50 is a standard sized 4 high EIA enclosure and includes flanges 86 for securing the enclosure into a standard 24" EIA rack.

Four power connectors 81 in the front of the power supplies 21 and 21 provide power and service control interfaces that consists of four identical compact cables (not shown), which plug directly into the connectors 81 in the front of the power supplies. These interfaces provide cross redundant connections to the entire subsystem, with the capability of concurrently servicing any of the cables. Each of the interface cables contain 350 VDC power and a full duplex differential RS-422 control interface.

FIG. 5 is a front view of the midplane 28. There are four connectors 90 on the front side of the midplane 28 for connection with mating connectors 63 on the rear of the DASD carriers 54. Each connector 90 has guide blocks 92 for blind mate to connectors 63 on the rear of the DASD backplanes 16. The connectors 90 are connected to the midplane 28 by flex conductors 96. Mounted above the front of the midplane 28 are connectors 98, each of which connect to two air moving devices 52. Each power supply 21 and 22 power two air moving devices 52, but power supply 22 handles the first and third air moving devices, and power supply 21 handles the second and fourth air moving devices 52, so that cooling air is always being moved on both sides of the enclosure 50, even if one of the power supplies should fail. As mentioned in connection with FIG. 2, the air moving devices 52 are sized to pass above the connectors 90. In the lower part of the front of the midplane 28 are power 100 and signal 101 connectors to mate with power and signal connectors 56 (see FIG. 2) on the back of power supplies 21 and 22. The midplane connectors 100 include alignment pins 102 (see also FIG. 6) to align the connectors 56. The connectors for the air moving device on the back of the power supplies 21 and 22 are allowed to float for final alignment, as is well known.

Figure 6:
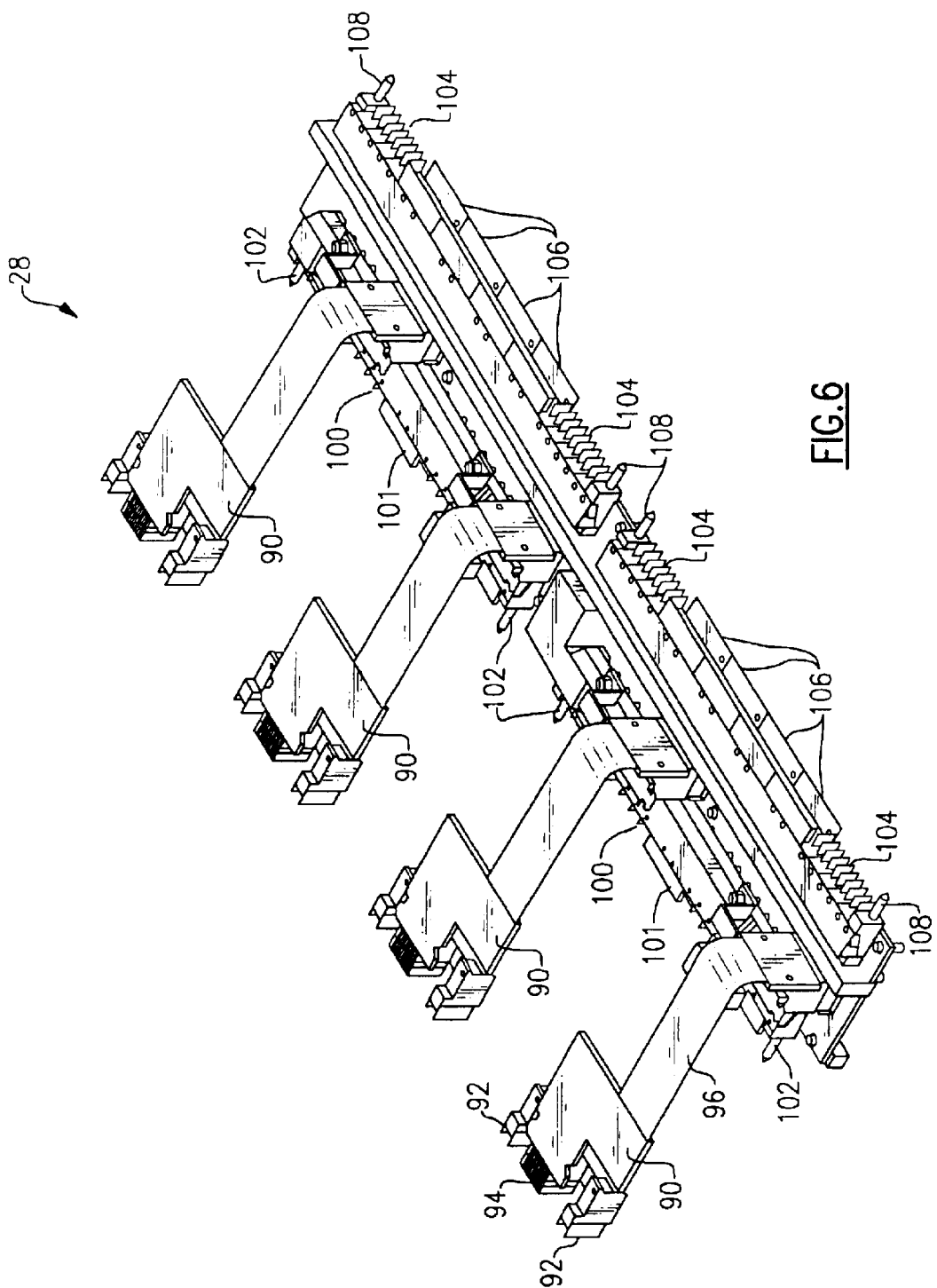
FIG. 6 is rear view of the midplane of the present invention.

FIG. 6 is a rear view of the midplane 28. The rear of the midplane 28 includes a connector assembly having power 104 and signal connectors 106 for mating with power and signal connectors 157 on the back of the planar boards 14A and 14B of FIG. 1, as will be explained further in relation to FIGS. 7 and 8. The power connectors 104 include alignment pins 108 to align floating connectors on the back of the planar boards 14A and 14B.

Figure 7:
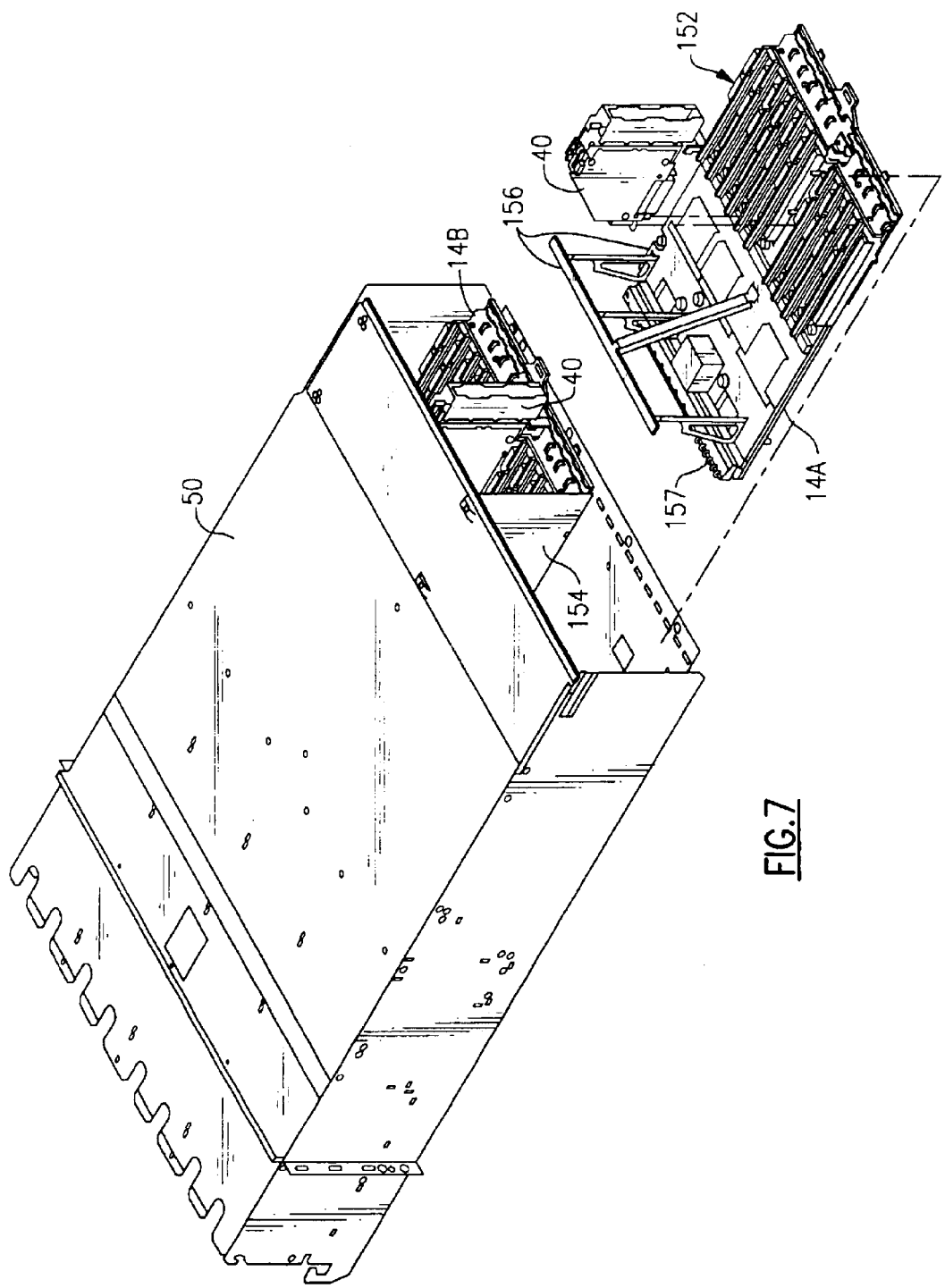
FIG. 7 is a partially exploded rear view of the enclosure of the present invention showing an enclosure for the I/O subsystem with one of the planar boards of the invention removed.

FIG. 7 is a partially exploded rear view of the enclosure of FIG. 1. FIG. 7 shows the enclosure 50 with one of the planar boards 14A removed, and planar board 14B fully seated within the enclosure 50. The riser 40 of the planar board 14A is exploded, and a riser 40 is seated in the middle of the planar board 14B. The planar boards 14 includes rail connectors 152 onto which the PCI card assemblies (to be discussed in connection with FIG. 8) may be latched. A stiffener 154 is provided between the planar cards 14A and 14B to form two bays for the planar boards 14. A planar stiffener 156 is also provided on each planar board 14 to help guide the planar board 14 into its bay and provide support for PCI cassettes 158 and 160. Power and signal connectors 157 are provided on the back (the inmost edge) of each planar board 14.

Figure 8:
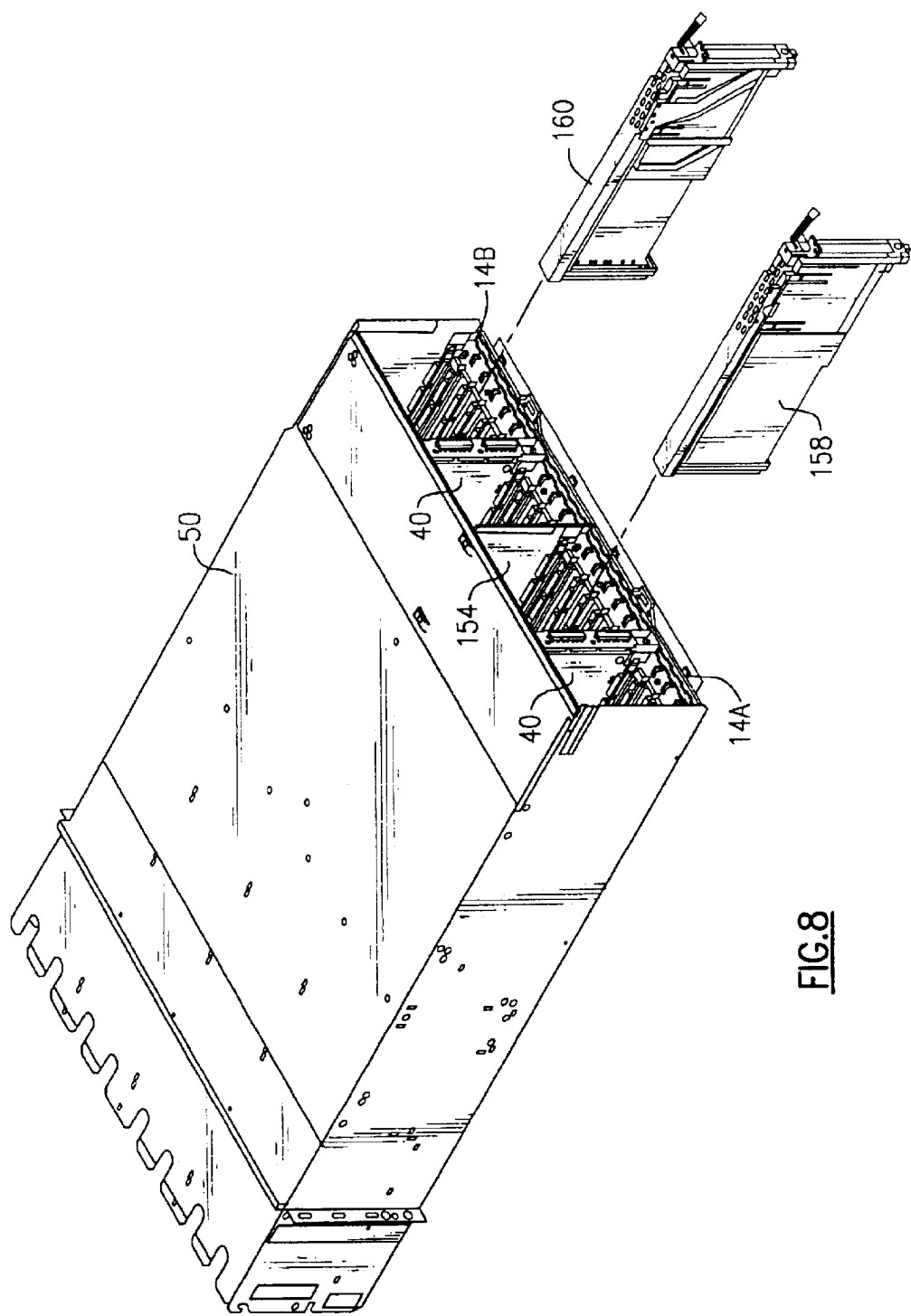
FIG. 8 is a partially exploded rear view of the enclosure of the present invention having two planar boards fully inserted into the enclosure and showing a PCI cassette and a PCI filler cassette exploded.

FIG. 8 is a partially exploded rear view of the enclosure 50 having the two planar boards 14A and 14B fully inserted into the enclosure 50. A PCI card assembly 158 is slidably engageable with one of the rail connectors 152 on the planar card 14. The PCI card assembly 158 includes a PCI card 15 of FIG. 1. The PCI card assembly is constructed in accordance with U.S. patent application Ser. No. 10/194,799 (Attorney Docket Number POU920020048US1) owned by the assignee of the present invention, and incorporated herein by reference. Where there is no PCI card 15 to be installed, a PCI filler cassette 160 is located in its slot and latched into place. The PCI filler cassette 160 has the same air resistance characteristics as a regular PCI card assembly 158 so that the flow of cooling air (to be explained) is not changed by the absence of a PCI card.

Figure 9:
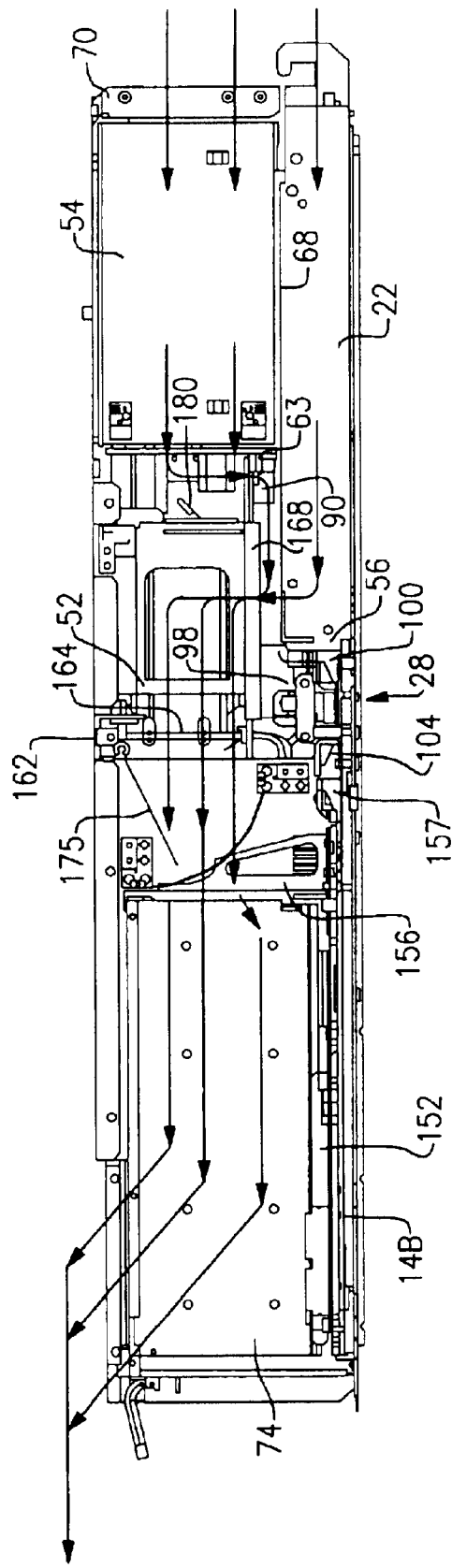
FIG. 9 is a section view of the enclosure showing the air flow through the enclosure.

FIG. 9 is a section view of the enclosure 50 showing the air flow through the enclosure 50. The air moving devices 52 are positioned in the enclosure 50 above the connectors 90 and behind the DASD carriers 54. Each air moving device 52 is placed on a secondary floor 168 which is raised from the horizontal stiffener 68. As previously mentioned, the air moving device 52 is a centrifugal blower whose input is at the bottom of the unit, and whose output is in the side 58 of the unit. Connectors 162 are attached to the top wall of the enclosure 50 to connect with connectors at the rear of the air moving devices 52, and cables 164 are connected between the connectors 98 and 162 for supplying power to the air moving devices 52. The secondary floor 168 has perforations (see FIG. 11) to allow air to pass through the cover 70, around the DASD drives 20, through the DASD carriers 54, through perforations 170 (see FIG. 11) in the secondary floor 168 and into the input in the bottom of the air moving device 52. Air is also drawn through the power supplies 21 and 22, and into the bottom of the air moving device 52. Air is expelled through the sides openings 58 of the air moving unit 52 and is deflected downwardly by a flap device 175 which also prevents re-circulation with a failed blower. The cooling air then passes around the PCI card assemblies 158 and flows out at the rear of the enclosure 50. A wire cage device 178 is provided at the rear of the air moving device 52 and flap device 175 for safety purposes. A handle 180 is provided on the front of the air moving device 52 to make positioning the air moving device 52 on top of the secondary floor 168 easier.

Figure 10:
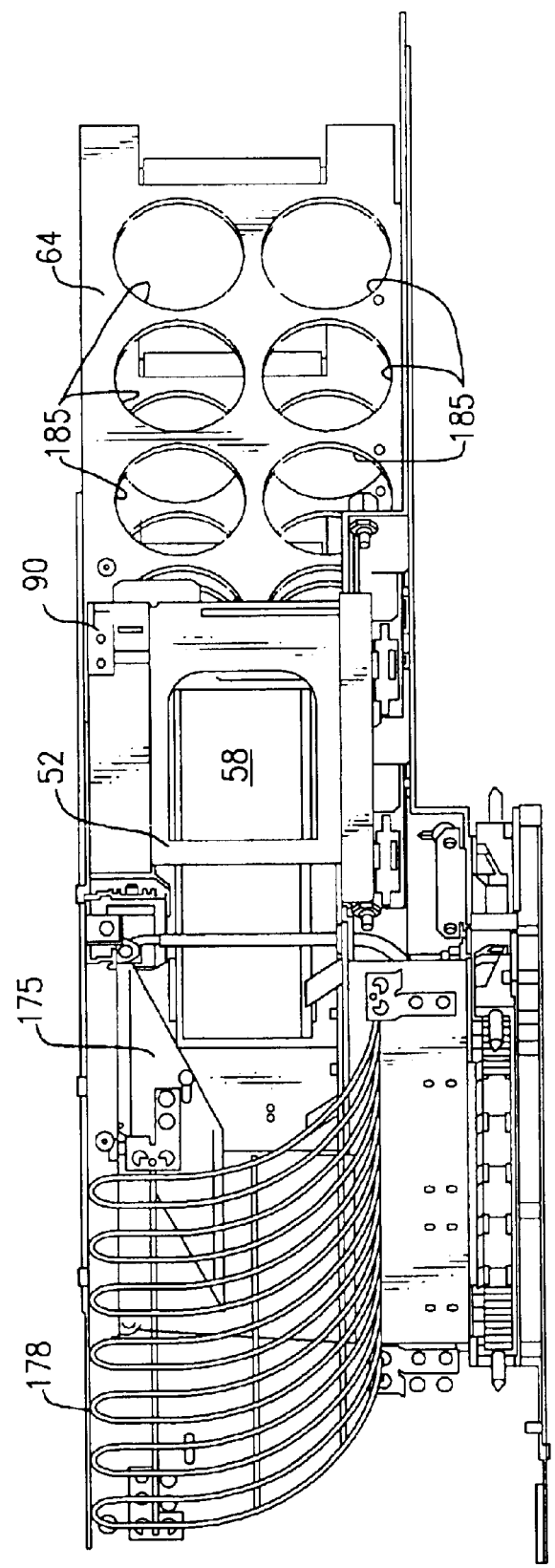
FIG. 10 is a slightly rotated side view looking from the back of the air moving device fully seated and latched in place.

FIG. 10 is a slightly rotated side view looking from the back of the air moving device 52 which is fully seated and latched in place. The stiffeners 64 have holes 185 for allowing air to freely move between the top front bays of the enclosure 50.

Figure 11:
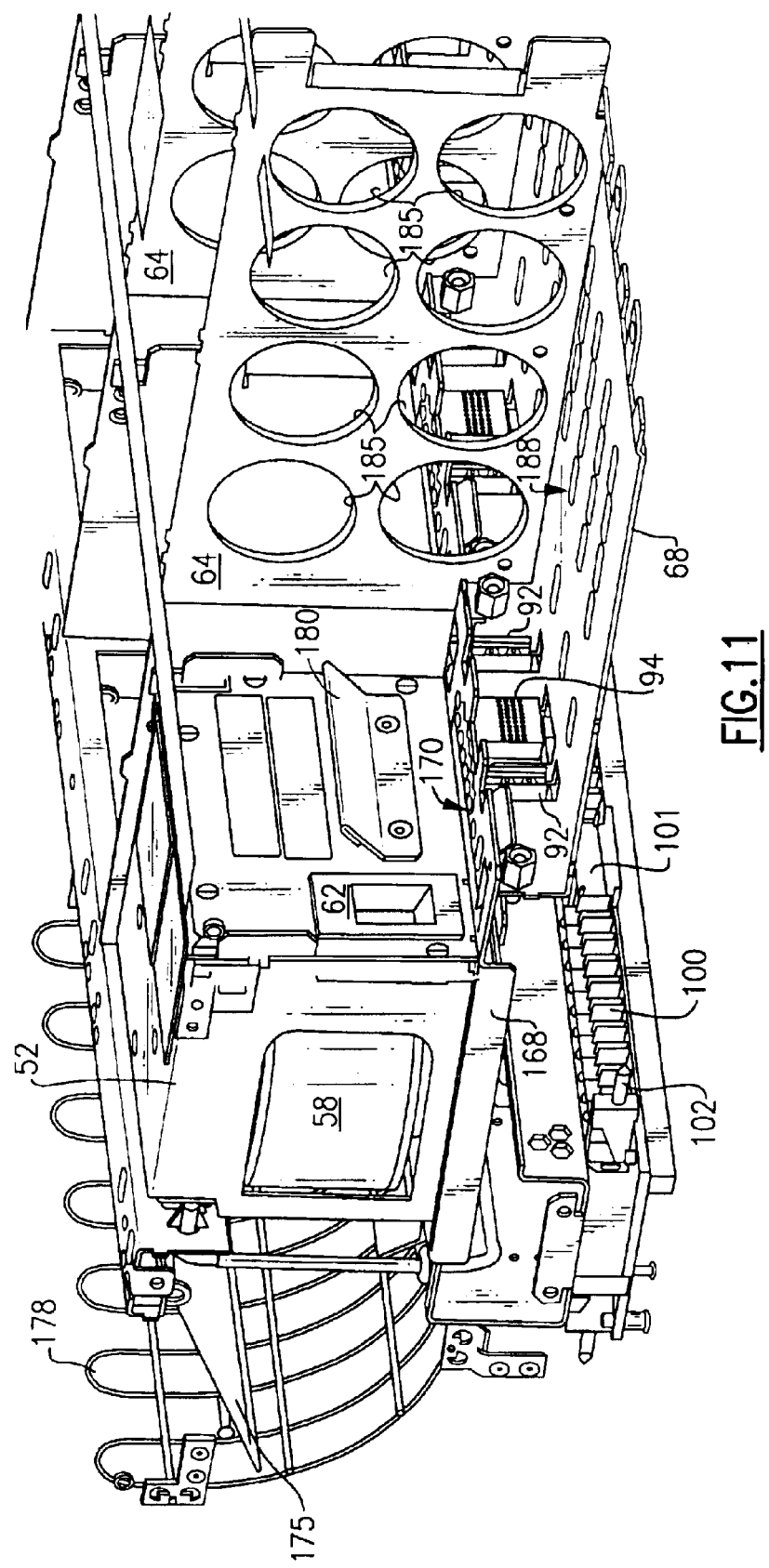
FIG. 11 is a slightly rotated side view looking from the front of the air moving device fully seated and latched in place.

FIG. 11 is a slightly rotated side view looking from the front of the air moving device 52 fully seated and latched in place. The horizontal stiffener 68 has slots 188 therein for letting cooling air freely move between the top and the bottom of the front portion of the enclosure 50. The connector 94 for the DASD backplanes 16 is shown in FIG. 11, but the DASD carrier 54 is not shown, for simplicity.

While the preferred embodiment of the invention has been illustrated and described herein, it is to be understood that the invention is not limited to the precise construction herein disclosed, and the right is reserved to all changes and modifications coming within the scope of the invention as defined in the appended claims.

What is claimed is:

1. An I/O subsystem for a data processing system comprising:
    an enclosure having a central portion, and front portion and a rear portion;
    a midplane in said central portion of said enclosure, said mid plane having forwardly connectors facing toward said front portion of said enclosure and backwardly facing connectors facing toward said rear portion of said enclosure;
    a horizontal stiffener in said front portion dividing said front portion into a top and a bottom;
    at least two power supply modules slidably located in the bottom of said front portion, said power supply modules having connectors connected to forwardly facing connectors in said midplane;
    at least two air moving devices slidably located in the top of said front portion, each of said air moving devices having a connector connected to a forwardly facing connector in said midplane, each air moving device being partially powered by each power supply such that air is moved through the I/O subsystem even if one power supply module fails; "wherein each air moving device is a centrifugal air blower having an input in the bottom of the blower and an output on the side of the blower, further comprising a flap at the rear of each air moving device for forcing the air expelled from the output of the air moving device to be forced down to pass over the entire PCI card assemblies latched on the planar boards, said flap closing if its associated air moving device fails such that air from a running air moving device cannot re-circulate through the failed air moving device, and said enclosure has air passages for allowing cooling air to be drawn into the front of the enclosure over the DASD drive assemblies and the power supplies in the front portion of the enclosure, into the intake of the blower, and expelled from the output of the blower over the PCI card assemblies on the planar boards and out the rear of the enclosure,"
    at least one DASD carrier slidably located in said top of said front portion, said DASD carrier having a backplane with connectors for hot plugging into forwardly facing connectors above said midplane;
    at least one DASD drive assembly slidably located in one of said DASD carriers, said DASD drive assembly having a connector connected to the hot plugging connectors of said DASD backplane;
    at least one planar board slidably located in the rear portion of said enclosure, said planar board having connectors connected to backwardly facing connectors in said midplane and a plurality of rails connectors;
    at least one PCI card assembly slidably engaged with one of the rail connectors and having a latch for making a hot plug electrical connection between the PCI card assembly and the rail connector and latching said PCI card assembly to the rail connector; and
    multiconductor power buses in said midplane for distributing power from said power supply to said air moving device, said DASD carrier and DASD drive assemblies in the DASD carrier, and said planar card and PCI card assemblies connected to said planar card.

2. The I/O subsystem of claim 1 wherein said two power supply modules form a redundant power supply system.

3. The I/O subsystem of claim 1 wherein said enclosure has connectors for four air moving devices, each air moving device located in the enclosure behind one of the DASD carriers.

4. The I/O subsystem of claim 1 wherein said enclosure has four DASD carriers, each DASD carrier having connections for four DASD drive assemblies.

5. The I/O subsystem of claim 1 wherein said enclosure has two planar boards, each planar board having rail connectors for ten PCI card assemblies.

6. The I/O subsystem of claim 1 further comprising a wire cage device behind said air moving unit in said enclosure.

7. The I/O subsystem of claim 1 further comprising at least one LED for each power supply, DASD drive assembly and PCI card assembly, said LEDs for identifying components that require replacement.

8. The I/O subsystem of claim 1 further comprising a soft switch connected between one of the power buses in said midplane and each of said planar board, PCI card assembly and DASD drive assembly for protecting said power buses from faults.

9. The I/O subsystem of claim 1 further comprising connectors in the front of said power supply for forming power and service control interfaces for providing cross redundant connections to the I/O subsystem.

* * * * *